(12) United States Patent
Musolin

(10) Patent No.: US 9,326,407 B1
(45) Date of Patent: Apr. 26, 2016

(54) AUTOMATED DIMMER WALL SWITCH WITH A COLOR MULTI-TOUCH LCD/LED DISPLAY

(71) Applicant: Sergey Musolin, Alexandria, VA (US)

(72) Inventor: Sergey Musolin, Alexandria, VA (US)

(73) Assignees: Alexander Uchenov, Moscow (RU); Sergey Musolin, Moscow (RU)

( * ) Notice: Subject to any disclaimer, the term of this patent is extended or adjusted under 35 U.S.C. 154(b) by 183 days.

(21) Appl. No.: 13/970,925

(22) Filed: Aug. 20, 2013

Related U.S. Application Data

(60) Provisional application No. 61/695,745, filed on Aug. 31, 2012, provisional application No. 61/754,583, filed on Jan. 20, 2013.

(51) Int. Cl.
*H05K 7/00* (2006.01)
*H02G 3/08* (2006.01)

(52) U.S. Cl.
CPC ... *H05K 7/00* (2013.01); *H02G 3/08* (2013.01)

(58) Field of Classification Search
CPC .................................. H02G 3/08; H05K 7/00
See application file for complete search history.

(56) References Cited

U.S. PATENT DOCUMENTS

| | | | | |
|---|---|---|---|---|
| 5,107,918 | A * | 4/1992 | McFarlane et al. | 165/238 |
| 5,499,935 | A * | 3/1996 | Powell | 439/620.05 |
| 5,566,879 | A * | 10/1996 | Longtin | 236/46 R |
| 6,692,093 | B1 * | 2/2004 | Park et al. | 312/405.1 |
| 8,829,799 | B2 * | 9/2014 | Recker et al. | 315/160 |
| 2002/0124992 | A1 * | 9/2002 | Rainer et al. | 165/11.1 |
| 2004/0260427 | A1 * | 12/2004 | Wimsatt | 700/275 |
| 2005/0001557 | A1 * | 1/2005 | Walko et al. | 315/149 |
| 2005/0033593 | A1 * | 2/2005 | Abrams | 705/1 |
| 2005/0090915 | A1 * | 4/2005 | Geiwitz | 700/90 |
| 2005/0125083 | A1 * | 6/2005 | Kiko | 700/19 |
| 2005/0162115 | A1 * | 7/2005 | Pendergrass | H03K 17/94 318/480 |
| 2006/0151678 | A1 * | 7/2006 | Shibata | 250/205 |
| 2006/0250745 | A1 * | 11/2006 | Butler et al. | 361/160 |
| 2007/0176566 | A1 * | 8/2007 | Fukumoto | 315/291 |
| 2007/0241203 | A1 * | 10/2007 | Wagner | F24F 11/0034 236/1 C |
| 2008/0006709 | A1 * | 1/2008 | Ashworth | F24F 11/0012 236/1 C |
| 2008/0034379 | A1 * | 2/2008 | Dale et al. | 719/321 |
| 2008/0291643 | A1 * | 11/2008 | Farago et al. | 361/747 |
| 2009/0140056 | A1 * | 6/2009 | Leen | 236/49.3 |
| 2009/0239587 | A1 * | 9/2009 | Negron et al. | 455/566 |
| 2010/0163713 | A1 * | 7/2010 | Cheng et al. | 250/214 AL |

(Continued)

OTHER PUBLICATIONS

Atmel 8-bit AVR Microcontroller with 16K Bytes In-System Programmable Flash for the ATmeta16 and ATmega16L, published by Atmel Corporation 2010, relevent Figure on p. 3.*

*Primary Examiner* — David M Sinclair
*Assistant Examiner* — Theron Milliser
(74) *Attorney, Agent, or Firm* — Bardmesser Law Group

(57) ABSTRACT

An automated dimmer switch is provided. The dimmer has a color sensor display embodied into plastic or metal housing. The dimmer includes a mother board, a central processor for processing incoming data, an operating memory and a flash memory. The dimmer also has various sensors for use with corresponding smart home technologies and a wireless module for connecting to a network standard IEEE 802.11a/b/n utilizing different internet protocols and chips for other wireless technologies such as Bluetooth and Z-Wave. The dimmer can include a motion sensor, such that the display image changes gradually from stand-by mode to display of interface icons for dimmer operation. The stand-by mode image when not in operation is derived from surrounding wall texture.

16 Claims, 16 Drawing Sheets

(56) References Cited

U.S. PATENT DOCUMENTS

| | | | |
|---|---|---|---|
| 2010/0193652 A1* | 8/2010 | Stajos et al. | 248/231.91 |
| 2011/0080423 A1* | 4/2011 | Kerofsky | 345/593 |
| 2011/0109538 A1* | 5/2011 | Kerr et al. | 345/156 |
| 2011/0118857 A1* | 5/2011 | Bodnar | 700/47 |
| 2012/0080944 A1* | 4/2012 | Recker et al. | 307/25 |
| 2013/0075579 A1* | 3/2013 | Chen | 250/205 |
| 2013/0120922 A1* | 5/2013 | Castle et al. | 361/679.08 |
| 2013/0147723 A1* | 6/2013 | Bias et al. | 345/173 |
| 2013/0328944 A1* | 12/2013 | Barnhoefer et al. | 345/690 |
| 2013/0345882 A1* | 12/2013 | Dushane et al. | 700/276 |
| 2014/0094936 A1* | 4/2014 | Saunders | 700/17 |

* cited by examiner

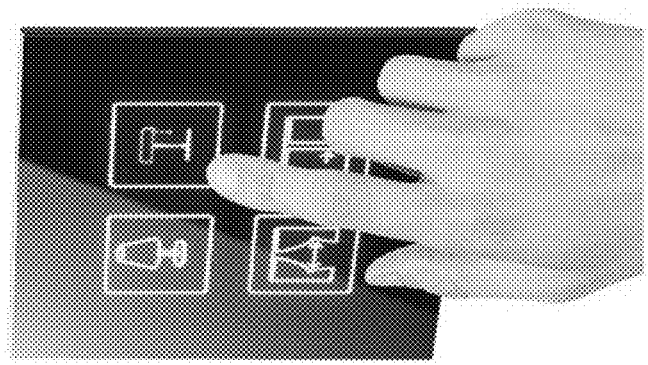
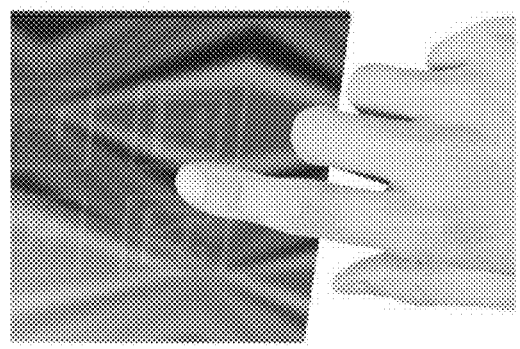
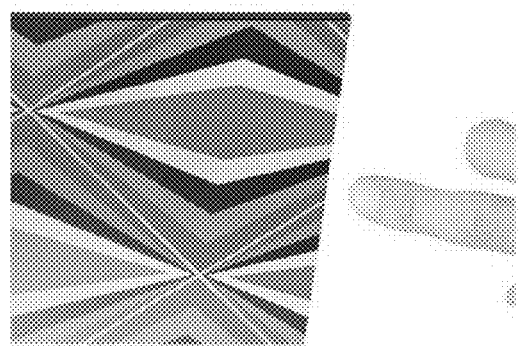
FIG.16

AUTOMATED DIMMER WALL SWITCH WITH A COLOR MULTI-TOUCH LCD/LED DISPLAY

CROSS-REFERENCE TO RELATED APPLICATIONS

This application claims priority to Provisional U.S. Patent Application No. 61/695,745, filed on Aug. 31, 2012 and to Provisional U.S. Patent Application No. 61/754,583 filed on Jan. 20, 2013 incorporated by reference herein in their entirety.

BACKGROUND OF THE INVENTION

1. Field of the Invention

This invention relates to light control systems, and in particular to a wall-mounted dimmer switch with a multi-touch screen control.

2. Description of the Related Art

Conventional light switches are commonly used for connecting/disconnecting electrical circuits and turning on and off electric equipment. The conventional switches include two positional commutation devices with disconnected contacts intended for electric networks using 1000 Volts.

The conventional switches are not designed for turning off short circuit electric currents. These currents require special manually controlled arc compensation devices. A conventional electric switch is typically placed inside the wall for hidden wiring or placed on the wall for external wiring.

Another conventional device is a dimmer used for regulation of power levels. The dimmer is typically placed after the power source within the circuit. The dimmers are used for controlling electric lamps (regular or halogen). Modern dimmers use thyristors connected to the power source via a diode bridge. All modern dimmers use triac power sources. However, conventional dimmers are not convenient for use, because they use buttons that need to be pressed by a user. The buttons can get stuck or get broken. The buttons require a user to look closely at the dimmer.

Accordingly, there is a need in the art for a convenient universal wall-mounted dimmer device that has a color multi-touch LCD/LED display used for settings and control of household devices.

SUMMARY OF THE INVENTION

Accordingly, the present invention is related to a dimmer with a multi-touch color LCD/LED display that substantially obviates one or more of the disadvantages of the related art.

In one embodiment, a dimmer switch is provided. The dimmer has a color multi-touch LCD/LED display embodied into plastic or metal housing. The dimmer includes a motherboard, a central processor for processing incoming data, RAM and, a flash memory, an audio processor with high sound quality and high performance suitable for compatible devices, a touch screen controller, and a WiFi/Bluetooth/Z-wave/WLAN chip. The dimmer also includes different sensors: an ambient light sensor, a proximity sensor, a sound sensor/mobile sound speaker, a temperature sensor, a humidity/moisture sensor, etc.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

In the drawings:

FIG. 16 illustrates a gradual change from standby mode to interface mode as the hand is brought closer to the dimmer.

DETAILED DESCRIPTION OF THE PREFERRED EMBODIMENTS

Figure 1:
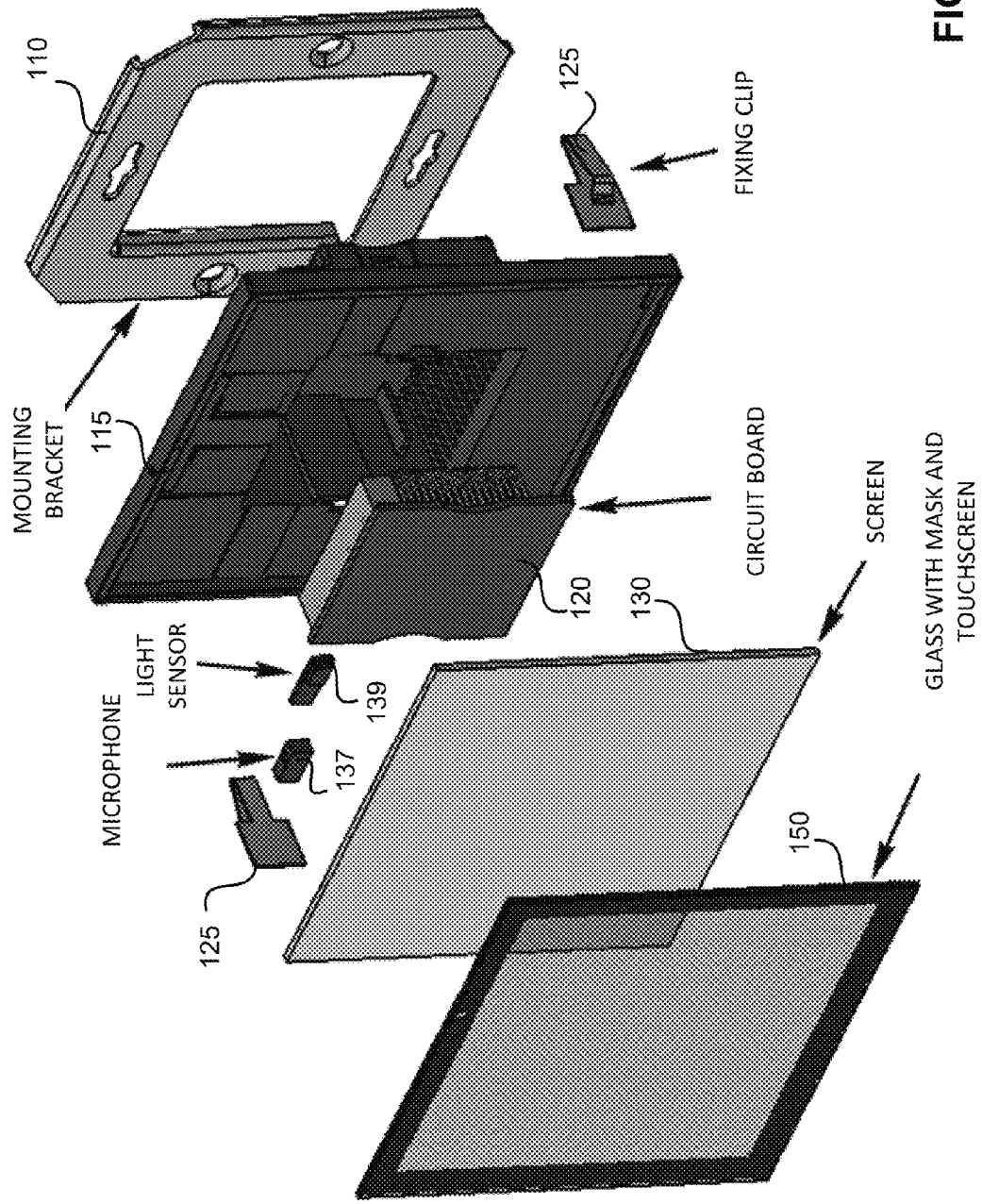
FIG. 1 illustrates a dimmer assembly, in accordance with the exemplary embodiment.

Reference will now be made in detail to the preferred embodiments of the present invention, examples of which are illustrated in the accompanying drawings.

According to an exemplary embodiment, a dimmer switch is provided that can be mounted in a standard wall socket. The dimmer has a color multi-touch LCD/LED display embedded into plastic or metal housing. The dimmer includes a motherboard, a central processor for processing incoming data, a RAM, a flash memory, a WiFi/Bluetooth/Z-wave/WLAN chip, an audio processor with high sound quality and high performance suitable for compatible devices. Additionally, the dimmer has sensors: an ambient light sensor, a proximity sensor, a sound sensor/mobile sound speaker, a temperature sensor, a humidity/moisture sensor, etc.

According to the exemplary embodiment, the dimmer device is controlled by a proprietary operating system. According to the exemplary embodiment, the dimmer can be also controlled by devices (for example, iOS/Android/Windows Mobile and/or other mobile platforms). The dimmer can be controlled through a web-portal or through the color multi-touch LCD/LED display integrated into the switch.

The dimmer can control household devices through the different wireless technologies, for example, through Wi-Fi, WLAN, Bluetooth, Z-wave, as well as using the X10 industry standard. According to the exemplary embodiment, the dimmer serves as a central multifunctional device for controlling home appliances and other devices without using any wires for connection to the home/household devices. A user can control all devices through a multi-touch LCD/LED display or mobile phones/tablets. For example, the user can control an air conditioner, lights, window blinds, etc. The dimmer can automatically control the environment using an ambient light sensor, a humidity/moisture sensor and a temperature sensor. In other words, a wireless control of all of the home appliances and equipment is provided.

According to the exemplary embodiment, the dimmer has a high resolution multi-touch display for displaying different data (i.e., a text, images and video data). The dimmer display can show temperature, time, date, etc. The dimmer can also display data received from other dimmers placed at different locations, for example, in other rooms, permitting control of lighting and other functions from one dimmer.

Additionally, the dimmer can be connected to a Wi-Fi or other wireless network and receive data pertaining to weather, outside temperature, humidity, etc. According to one exemplary embodiment, the dimmer can be controlled by hand movements (i.e., air gestures) performed within 10-15 cm from the display sensor. Thus, the light or other settings can be changed without looking at the display screen. The dimmer can have programmed movements for different settings. For example, a single/double touch and a subsequent hand movement (air gesture) from right to left can change the intensity of the lighting and the up/down hand movement (air gesture) can change the room temperature, waving a hand or fingers near the switch in specific patterns, e.g., left-right air gesture, up-down air gesture, clicking of fingers (motion air gesture or sound), clapping (motion air gesture or sound), etc.

The dimmer can display a video stream acquired by the video cameras placed outside. For example, the dimmer can be connected to an entrance video camera and a door bell. So the user can hear the door bell and see who is at the door through the dimmer display. According to the exemplary embodiment, a sound can be turned off (if needed) by an external manual switch. Each individual device installed in the house is decentralized. The devices can also be combined into a decentralized ad-hoc network controlled by the dimmer.

Figure 12:
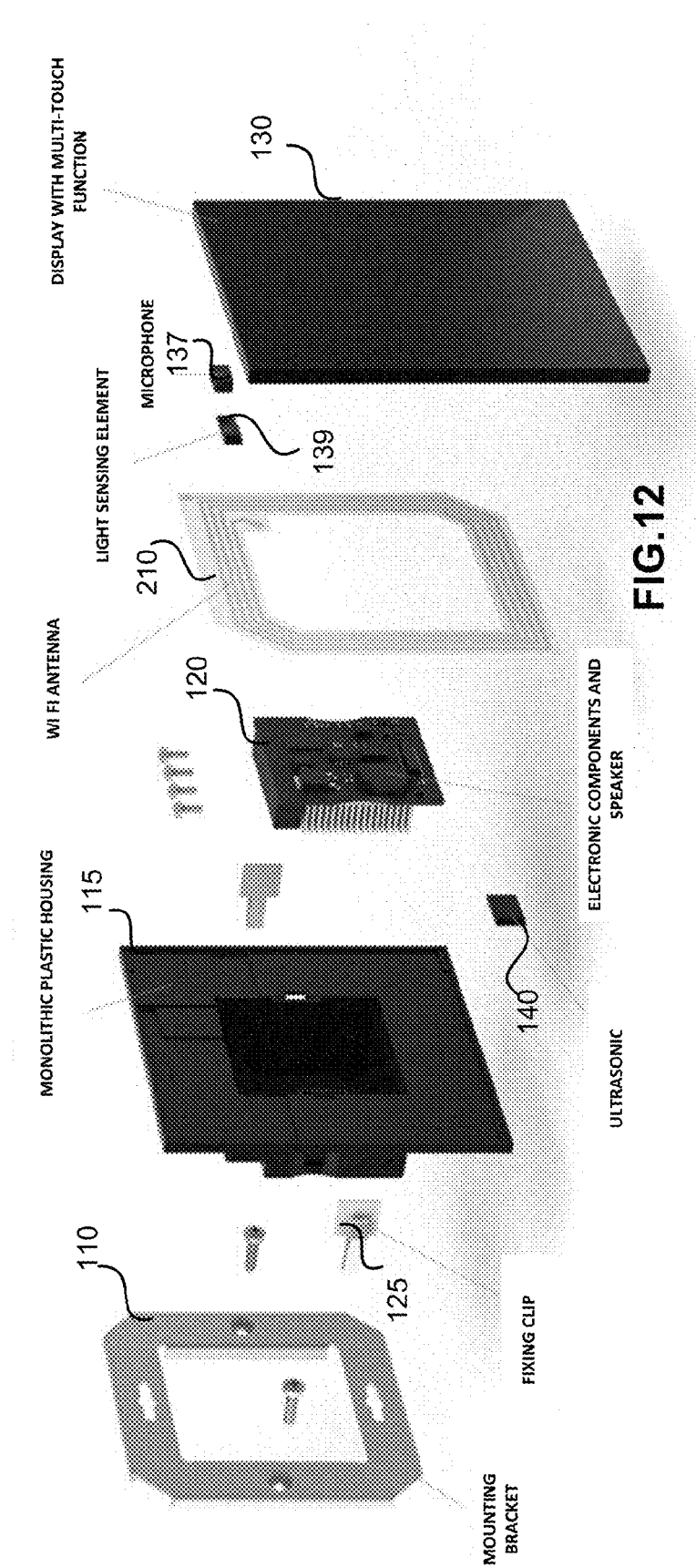
FIG. 12 illustrates a dimmer assembly, in accordance with another exemplary embodiment.
Figure 13:
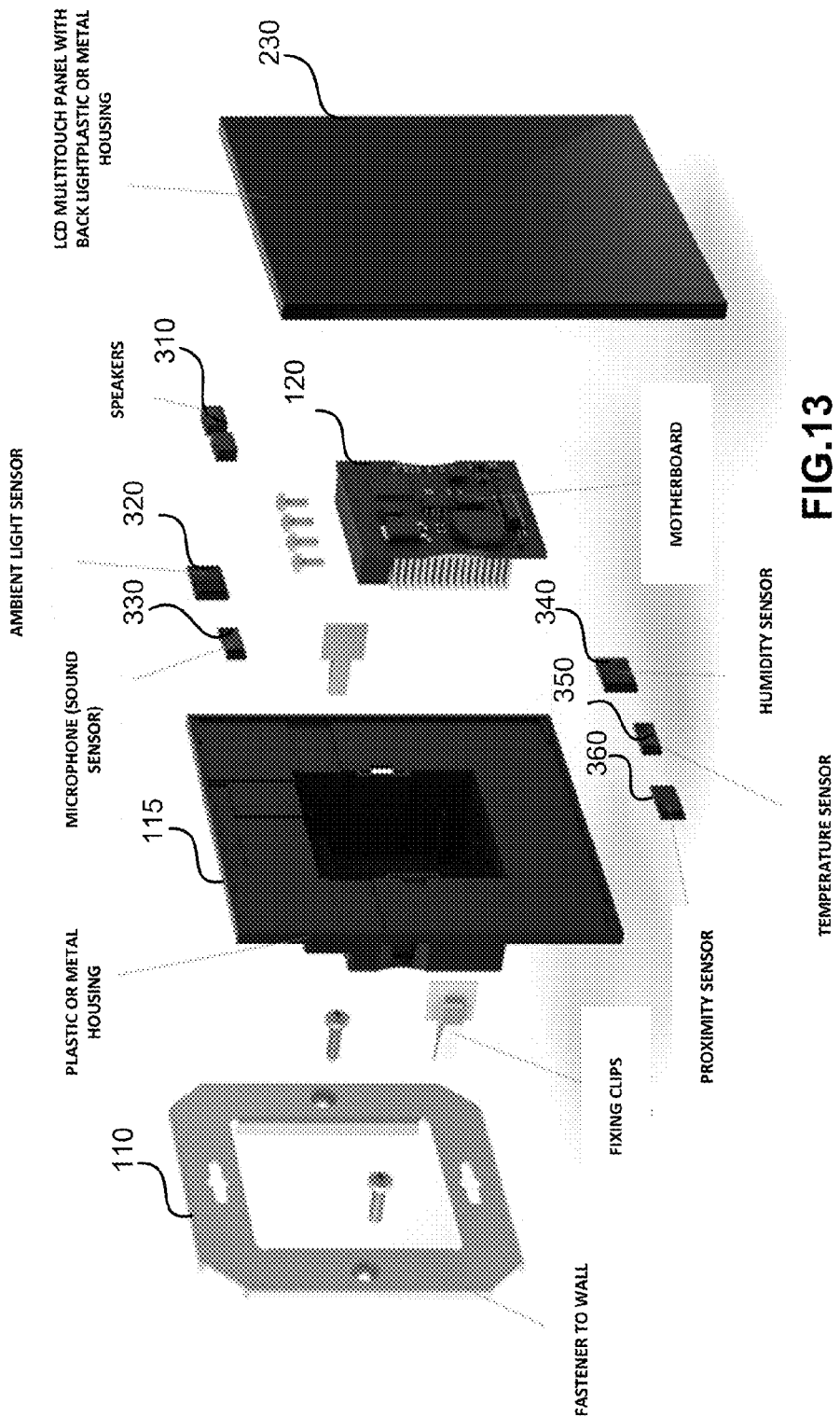
FIG. 13 illustrates a dimmer assembly, in accordance with another exemplary embodiment.

FIGS. 1, 12 and 13 illustrate dimmer assemblies, in accordance with the exemplary embodiments. The dimmer is placed into a housing (metal or plastic bracket) that attaches to the wall. The sensor display is placed on top of the dimmer and connected to the processor and the sensors. FIG. 1 illustrates a mounting bracket 110, a circuit board 120 placed into a housing 115, which connects to the mounting bracket by fixing clips 125. A light sensor 139 and a microphone 137 are integrated into the circuit board 120. The circuit board is coupled to a screen 130 covered with a touch screen mask 150.

FIGS. 12 and 13 illustrate the dimmer assembly, in accordance with another exemplary embodiment. The exemplary assembly includes a Wi-Fi antenna and different sensors. FIG. 12 illustrates a mounting bracket 110, a circuit board 120 placed into a housing 115, which connects to the mounting bracket by fixing clips 125. A light sensor 139, a microphone 137 and an ultrasonic element 140 are integrated into the circuit board 120. The circuit board 120 is coupled to a screen 130 covered with a touch screen mask 150. The dimmer uses a Wi-Fi antenna 210.

FIG. 13 illustrates a mounting bracket 110, a circuit board 120 placed into a housing 115, which connects to the mounting bracket by fixing clips 125. A microphone 137, an ambient light sensor 320, speakers 310, a proximity sensor 360, a temperature sensor 350, a humidity sensor 340 are integrated into the mother board 120. The mother board 120 is coupled to an LCD panel 130 covered with a housing.

Figure 2:
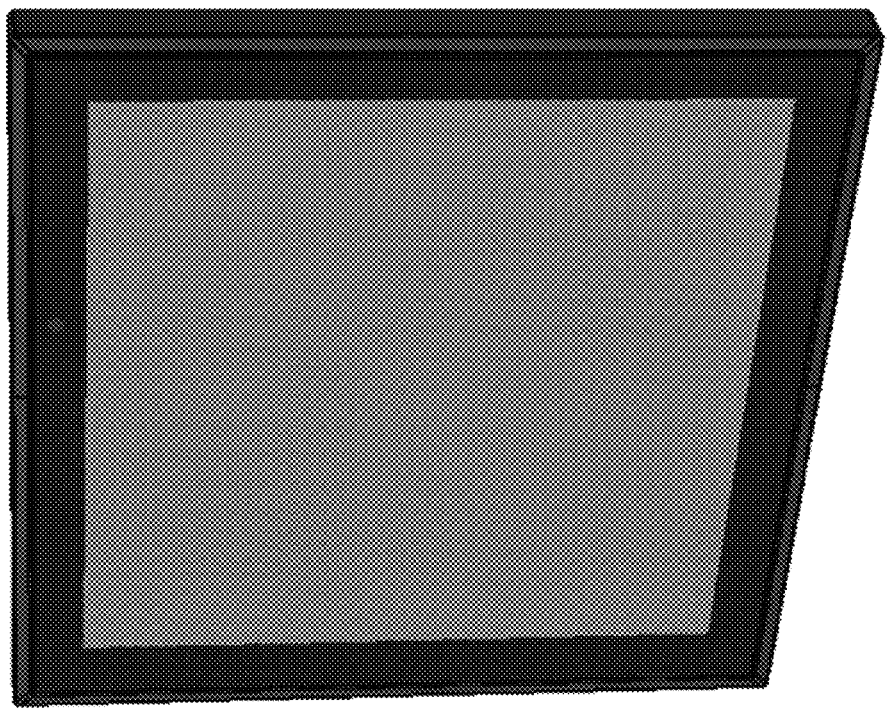
FIG. 2 illustrates how assembled dimmer looks on the wall.
Figure 3:
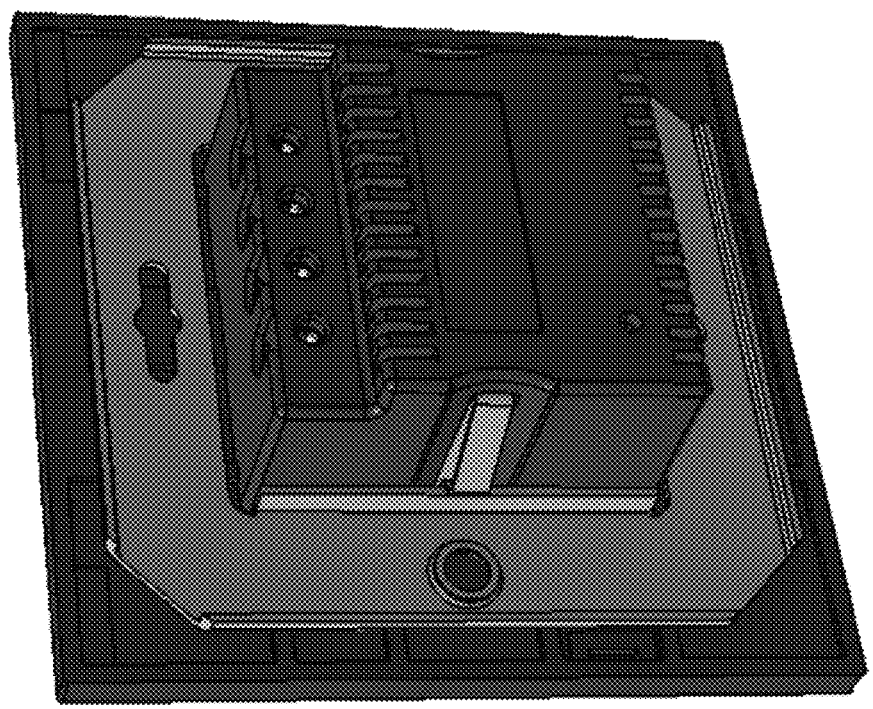
FIG. 3 illustrates back view of the assembled dimmer.
Figure 4:
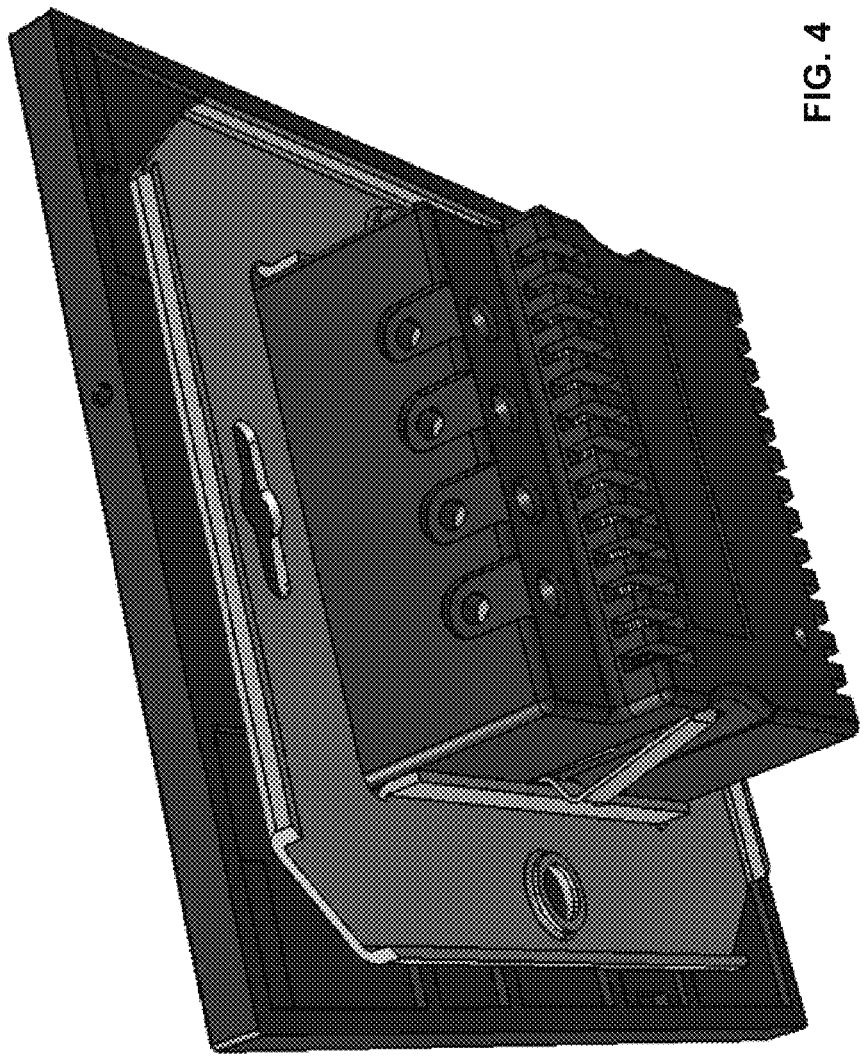
FIG. 4 illustrates the assembled dimmer shown from the top.
Figure 5:
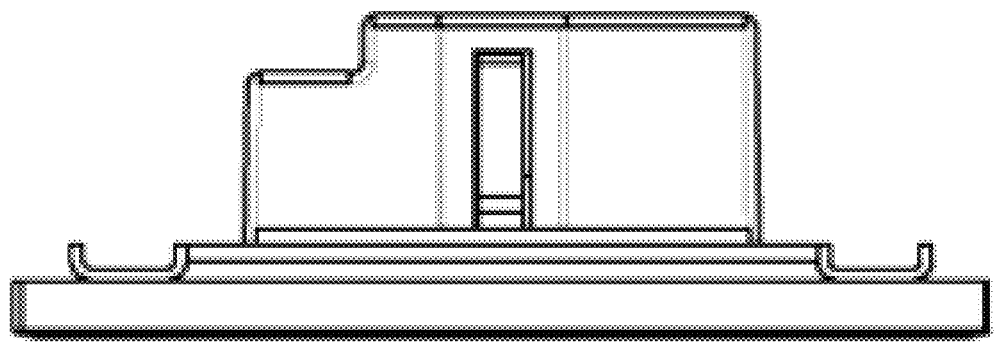
FIGS. 5 and 6 illustrate vertical and horizontal side views of an exemplary dimmer.
Figure 6:
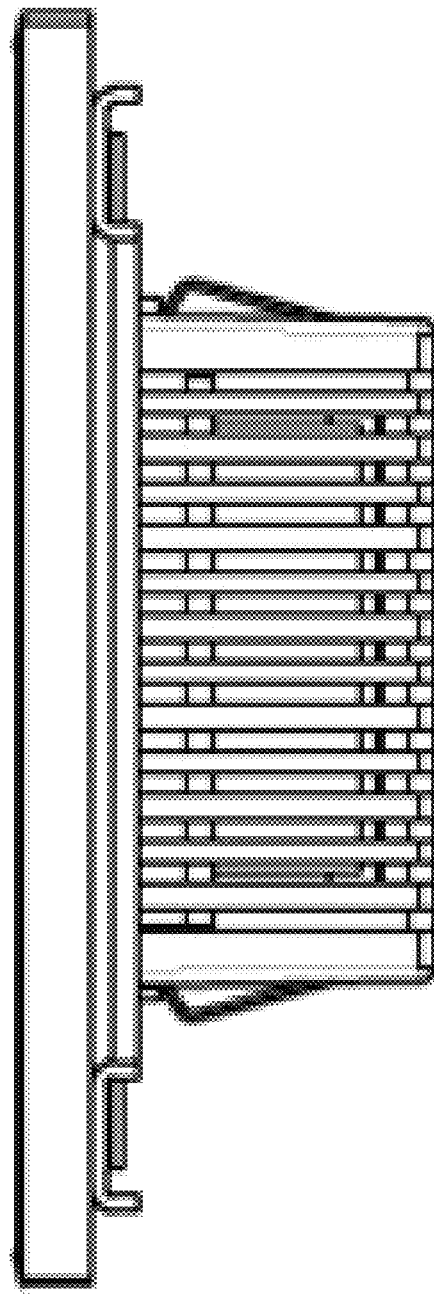
Figure 7:
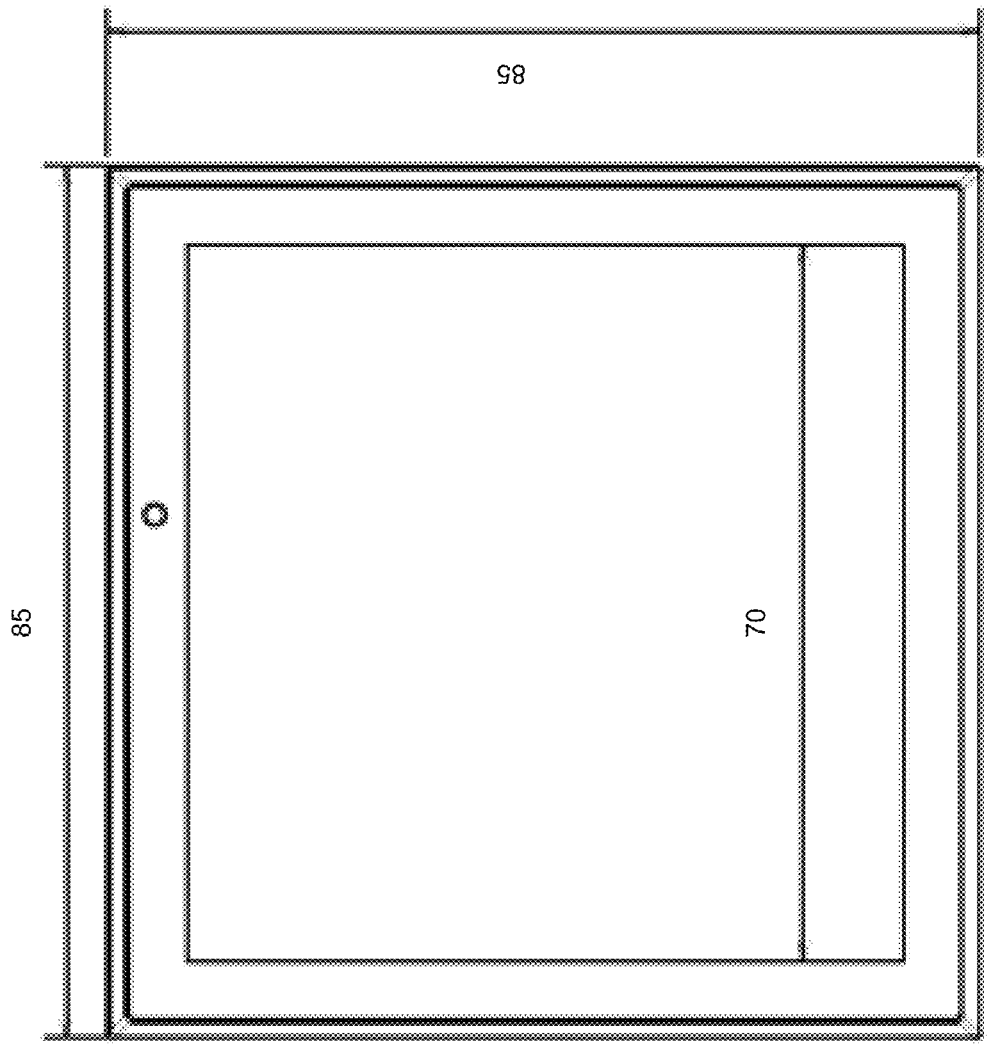
FIG. 7 illustrates an exemplary dimensions of a color sensor screen.
Figure 8:
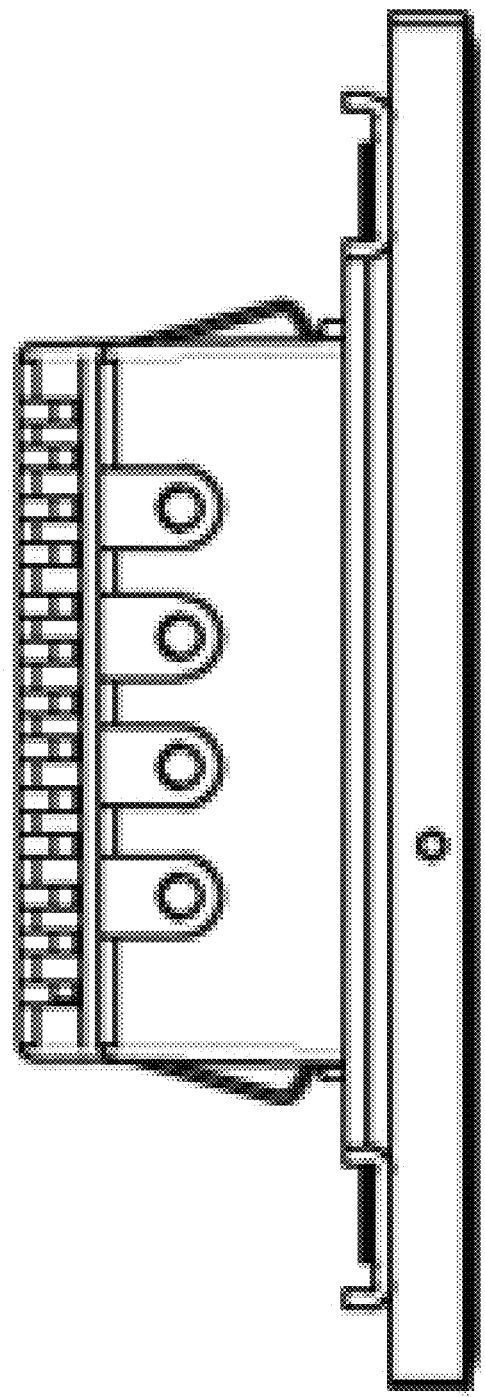
FIG. 8 illustrates a left side view of the dimmer having exemplary dimensions shown in FIG. 9.
Figure 9:
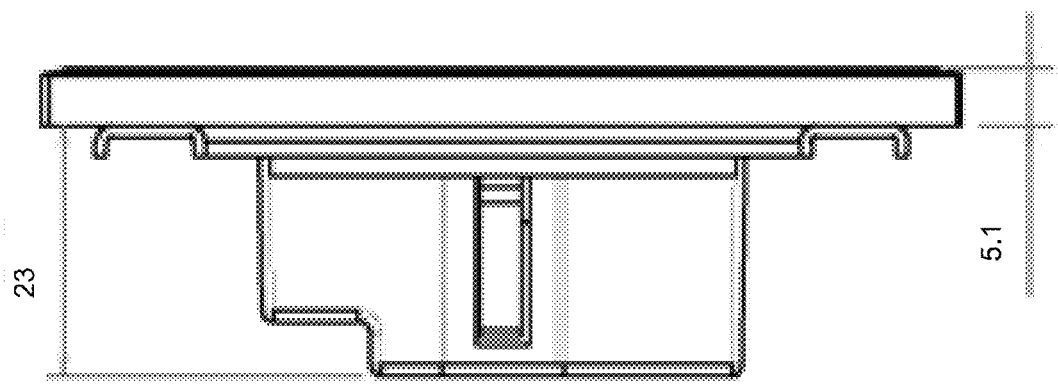
Figure 10:
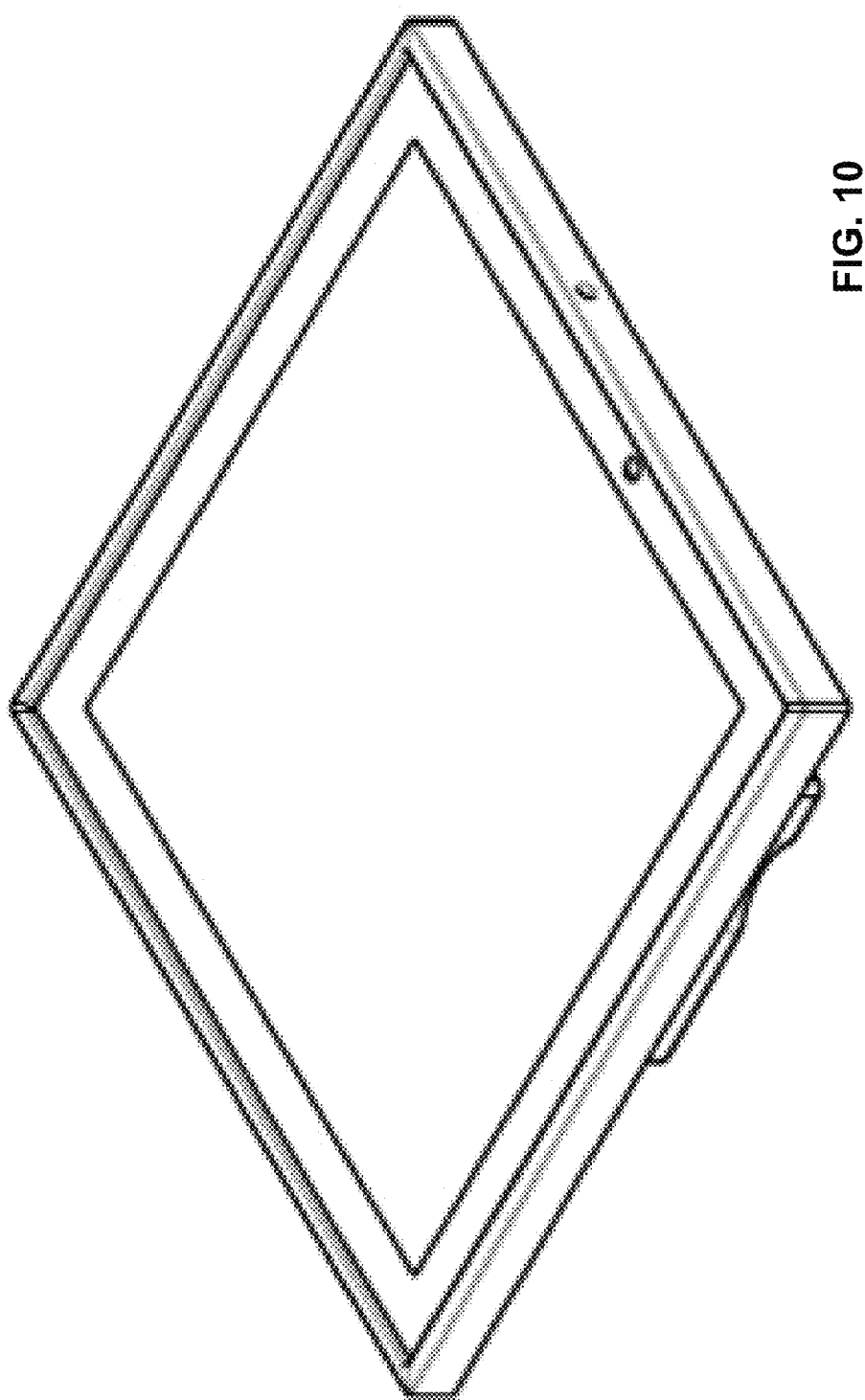
FIG. 10 illustrates a color sensor display.
Figure 11:
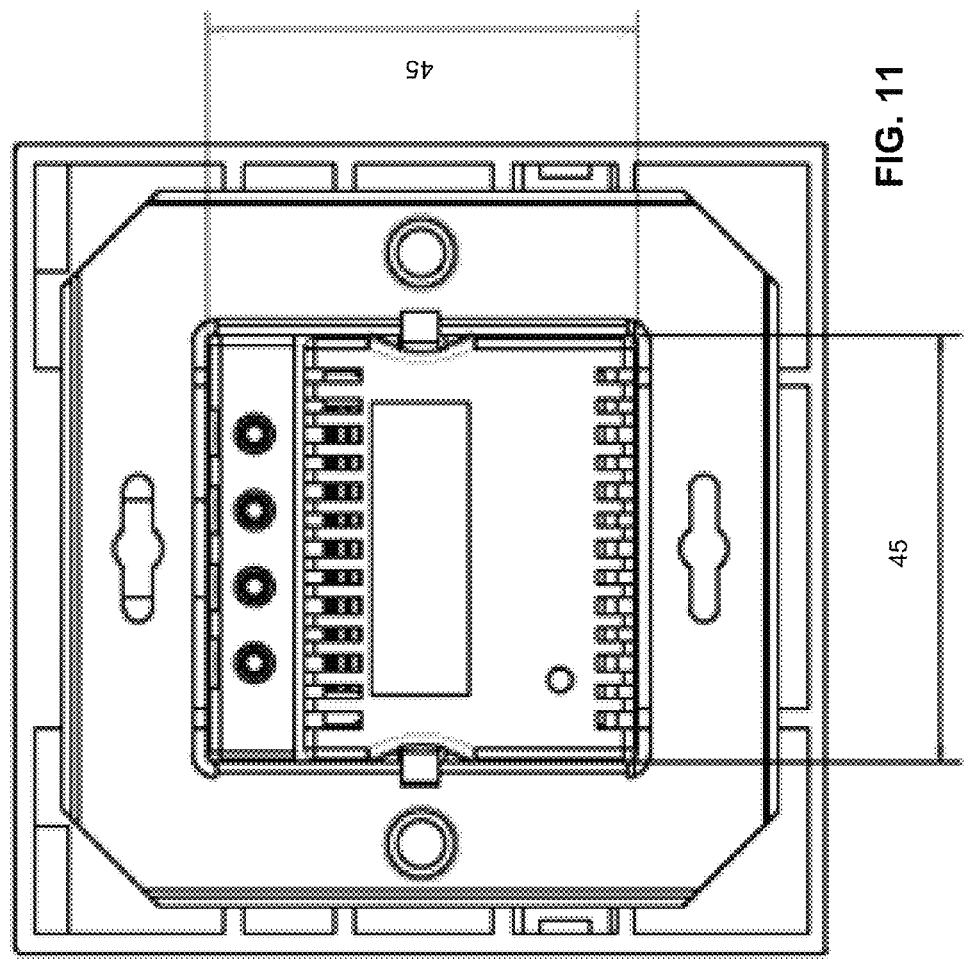
FIG. 11 illustrates a dimmer assembly with the exemplary dimensions.

FIG. 2 illustrates how assembled dimmer looks on the wall. FIG. 3 illustrates back view of the assembled dimmer. The rectangular dimmer fits into a wall pocket with the display facing outwards. FIG. 4 illustrates the assembled dimmer shown from the top. FIGS. 5 and 6 illustrate vertical and horizontal side views of an exemplary dimmer. FIG. 7 illustrates an exemplary dimensions of a color sensor screen depicted in FIG. 10. FIG. 8 illustrates a left side view of the dimmer having exemplary dimensions shown in FIG. 9. FIG. 11 illustrates a dimmer assembly with the exemplary dimensions.

Figure 14:
FIGS. 14 and 15 illustrate the display screen of the dimmer having the same stand by display as the wall texture.
Figure 15:

According to one exemplary embodiment, the dimmer display is positioned flush with the wall. According to the exemplary embodiment, the dimmer appears to be fully "merged" into the wall as shown in FIGS. 14 and 15. The dimmer display screen can show a raster image of the texture of the wall, e.g., of the wallpaper, or of the brick or stone texture, etc. (see FIGS. 14 and 15). The dimmer device supports all major formats for imaging, such as *.gif, *.png, *.jpeg, *.jpg, *.bmp, etc. Once an image of the wall is taken, it can be transmitted to the device through a wireless connection, or through web-interface using a browser. Alternatively, a picture of the wall can be taken by a mobile device (e.g., iPhone or iPad) and sent to the dimmer via Wi-Fi or Bluetooth.

According to the exemplary embodiment, the dimmer can use default view settings. A user can select colors from standard color scales, such as RAL, RR, NSC, PMS (Pantone), as well as RGB and CMYK. The user can set the display "stand-by" color and screensaver. The user can define the size/scale of the dimmer screen image and its contrast. The stand-by image is normally displayed on the screen of the dimmer when the user is not performing operations with the controls of the dimmer. According to one exemplary embodiment, the dimmer can be used as a night light—the screen remains lit at night, for example, at 80-90% of its brightness for one or two hours.

A built-in motion sensor of the dimmer can detect the presence of objects or people within a pre-set range of the dimmer device. For example, when user's hand is brought close to the dimmer display (e.g., performing an air gesture 20 cm or closer), the dimmer screen gradually changes, as the hand gets closer. The screen image changes from the standby image to a screen image with icons of the interface menu, as shown in FIG. 16. The time for returning to the stand-by mode can be set by the user. The user can perform some touch screen actions and within, for example, 10 or 20 seconds, the display returns to the screensaver view. Alternatively, the dimmers screen turns off or becomes "invisible" by displaying the wall image as shown in FIGS. 14 and 15.

Having thus described a preferred embodiment, it should be apparent to those skilled in the art that certain advantages of the described method and apparatus have been achieved. In particular, those skilled in the art would appreciate that the proposed apparatus provides a convenient dimmer equipped with a color multi-touch display.

It should also be appreciated that various modifications, adaptations and alternative embodiments thereof may be made within the scope and spirit of the present invention. The invention is further defined by the following claims.

What is claimed is:

1. An automated universal wall-mountable dimmer comprising:

a housing;

a motherboard mounted in the housing;

a processor on the motherboard that controls environmental parameters of a room;

a memory coupled to the processor;

a color sensor display connected to the motherboard and attached to the housing, wherein, the color sensor display, in a quiescent state, displays a raster image that matches a pattern and color of a wall on which the dimmer is mounted, wherein a pattern on the display is aligned with the pattern of the wall so as to make the dimmer substantially invisible in the quiescent state, and wherein the raster image is received from a mobile device via a wireless connection;

a sensor configured to detect an approaching person, wherein, in response to the detection by the sensor, the color sensor display displays an icon-based graphical user interface, wherein the color sensor display displays data provided by the processor and receives user control inputs via user gestures that are detected when performed about 10-20 cm from the color sensor display, and wherein the dimmer is configured to communicate with other dimmers such that environmental parameters in other rooms where the other dimmers are located can be controlled from the dimmer.

2. The dimmer of claim 1, wherein the dimmer is controllable remotely by a mobile device, including controlling the environmental parameters.

3. The dimmer of claim 1, further comprising an ambient light sensor.

4. The dimmer of claim 1, wherein the sensor includes a proximity sensor configured to detect the person within a pre-set proximity of the dimmer.

5. The dimmer of claim 1, further comprising a microphone.

6. The dimmer of claim 1, further comprising a sound speaker.

7. The dimmer of claim 1, further comprising a temperature sensor.

8. The dimmer of claim 1, further comprising a humidity/moisture sensor.

9. The dimmer of claim 1, further comprising a manual switch.

10. The dimmer of claim 1, wherein the memory is located on the motherboard.

11. The dimmer of claim 1, further comprising a flash memory located on the motherboard.

12. The dimmer of claim 1, further comprising an audio processor located on the motherboard, with high sound quality and high performance suitable for compatible devices.

13. The dimmer of claim 1, further comprising a touch screen controller for control of the color sensor display located on the motherboard.

14. The dimmer of claim 1, wherein the display includes a front glass panel.

15. The dimmer of claim 1, wherein the display includes an LCD panel.

16. The dimmer of claim 15, wherein the display includes an LED backlight for the LCD panel.

* * * * *